United States Patent
Park et al.

(10) Patent No.: US 7,542,346 B2
(45) Date of Patent: Jun. 2, 2009

(54) MEMORY DEVICE AND METHOD FOR OPERATING THE SAME

(75) Inventors: Sang-Jin Park, Yongin-si (KR);
Young-Soo Park, Suwon-si (KR);
Sang-Min Shin, Seoul (KR);
Young-Kwan Cha, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 86 days.

(21) Appl. No.: 11/704,204

(22) Filed: Feb. 9, 2007

(65) Prior Publication Data

US 2007/0211533 A1 Sep. 13, 2007

(30) Foreign Application Priority Data

Mar. 11, 2006 (KR) ...................... 10-2006-0022895

(51) Int. Cl.
*G11C 16/04* (2006.01)
(52) U.S. Cl. ............................. 365/185.18; 365/185.01; 365/185.29
(58) Field of Classification Search ............ 365/185.18, 365/185.29, 185.01
See application file for complete search history.

(56) References Cited

U.S. PATENT DOCUMENTS 7,272,043 B2 * 9/2007 Liao et al. .............. 365/185.18

* cited by examiner

*Primary Examiner*—Huan Hoang
(74) *Attorney, Agent, or Firm*—Harness, Dickey & Pierce

(57) ABSTRACT

A memory device and method for operating the same are provided. The example method may be directed to a method of performing a memory operation on a memory device, and may include applying a negative voltage bias to the memory device during a programming operation of the memory device and applying a positive voltage bias to the memory device during an erasing operation of the memory device. The example memory device may include a substrate and a gate structure formed on the substrate, the gate structure exhibiting a faster flat band voltage shift under a negative voltage bias than under a positive voltage bias, the gate structure receiving a negative voltage bias during a programming of the memory device and receiving a positive voltage bias during an erasing operation of the memory device.

18 Claims, 8 Drawing Sheets

MEMORY DEVICE AND METHOD FOR OPERATING THE SAME

PRIORITY STATEMENT

This application claims the benefit of Korean Patent Application No. 10-2006-0022895, filed on Mar. 11, 2006, in the Korean Intellectual Property Office, the disclosure of which is incorporated herein in its entirety by reference.

BACKGROUND OF THE INVENTION

1. Field of the Invention

Example embodiments of the present invention relate generally to a memory device and method for operating the same, and more particularly to a memory device and method of performing memory operations on the memory device.

2. Description of the Related Art

Non-volatile memory devices may retain stored data even if power is not continuously provided. Flash memory devices may be examples of non-volatile memory devices. Examples of flash memory devices may include a floating-gate type memory device, in which a floating gate may be formed between dielectric layers for accumulating electric charges, and a charge-trap type memory device, in which a charge trapping layer may be formed between dielectric layers for accumulating electric charges by using the charge trapping layer as a storage node.

An example of the charge-trap type memory device may be a silicon-oxide-nitride-oxide-silicon (SONOS) memory device that uses a silicon nitride layer as the charge trapping layer. In a conventional SONOS memory device, a tunnel insulation layer, a charge trapping layer, and a blocking insulation layer may be stacked on a silicon substrate where a source region and a drain region may be formed, and a gate electrode may be formed on the blocking insulation layer. The tunnel insulation layer and the blocking insulation layer may be formed substantially of silicon oxide ($SiO_2$), and the charge trapping layer may be formed substantially of silicon nitride ($Si_3N_4$).

If a silicon nitride layer is used for the charge trapping layer, an erasing speed (e.g., "clearing" data of the SONOS memory device, such as to a default logic level) under a negative voltage bias may be relatively low and a programming speed under a positive voltage bias may be relatively high, as shown in FIGS. 1A and 1B.

FIG. 1A illustrates flat band voltage shifts (V_FB[V]) with respect to programming time if positive voltage biases are applied to a conventional SONOS memory device. FIG. 1B illustrates flat band voltage shifts (V_FB[V]) with respect to erasing time if negative voltage biases are applied to a conventional SONOS memory device.

In a NAND-type flash memory device, such as a SONOS memory device that employs Fowler-Nordheim (F-N) tunneling, a positive voltage bias may be applied to the memory device for programming in units of a "page" and a negative voltage bias may be applied to the memory device for erasing in units of a "block".

However, if the trapping layer is formed of a material that responds relatively slowly to a positive voltage but relatively quickly or rapidly to a negative voltage, the above-described scheme using a positive voltage bias for programming in units of a page and a negative voltage bias for erasing in units of a block may be inefficient.

SUMMARY OF THE INVENTION

An example embodiment of the present invention is directed to a method of performing a memory operation on a memory device, including applying a negative voltage bias to the memory device during a programming operation of the memory device arid applying a positive voltage bias to the memory device during an erasing operation of the memory device.

Another example embodiment of the present invention is directed to a memory device, including a substrate and a gate structure formed on the substrate, the gate structure exhibiting a faster flat band voltage shift under a negative voltage bias than under a positive voltage bias, the gate structure receiving a negative voltage bias during a programming of the memory device and receiving a positive voltage bias during an erasing operation of the memory device.

Another example embodiment of the present invention is directed to an improved programming and erasing method of a memory device that exhibits a faster flat band voltage shift under a negative voltage bias and a slower speed under a positive voltage bias.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS OF THE PRESENT INVENTION

Figure 1A:
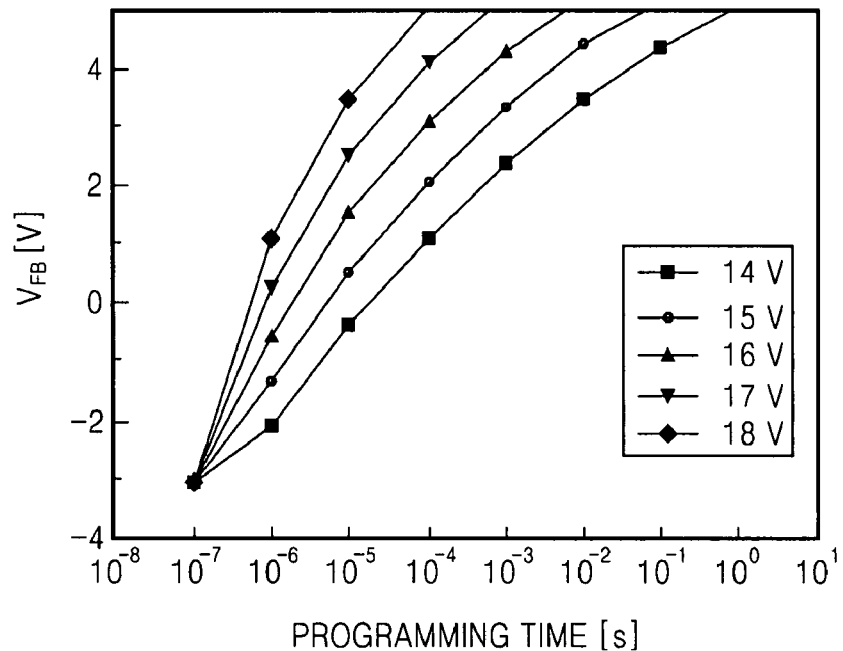
FIG. 1A illustrates flat band voltage shifts (V_FB[V]) with respect to programming time if positive voltage biases are applied to a conventional SONOS memory device.

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while example embodiments of the invention are susceptible to various modifications and alternative forms, specific embodiments thereof are shown by way of example in the drawings and will herein be described in detail. It should be understood, however, that there is no intent to limit example embodiments of the invention to the particular forms disclosed, but conversely, example embodiments of the invention are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
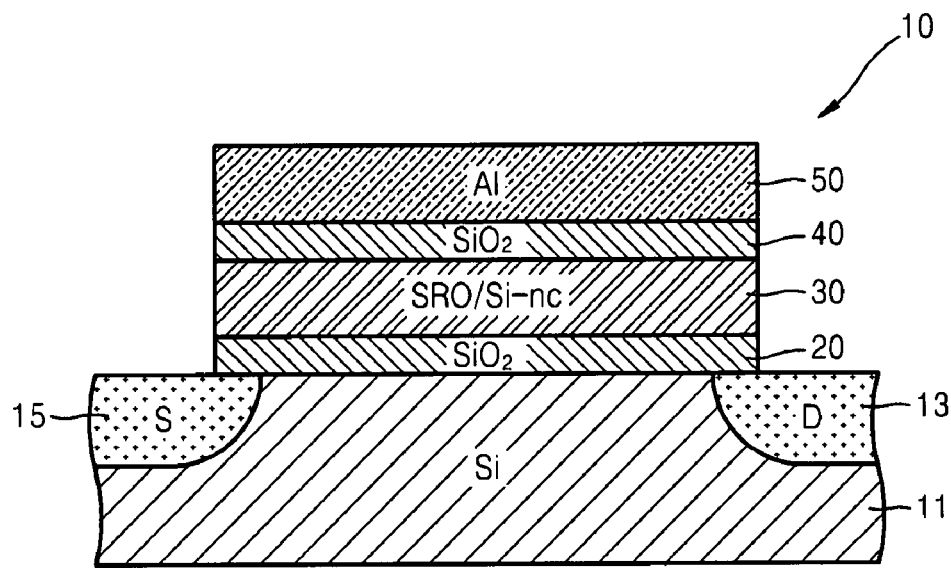
FIG. 2 illustrates a memory device according to an example embodiment of the present invention.

FIG. 2 illustrates a memory device 10 according to an example embodiment of the present invention. In the example embodiment of FIG. 2, the memory device 10 may include a substrate 11 and a gate structure formed on the substrate 11.

In the example embodiment of FIG. 2, the gate structure may be formed to exhibit a faster flat band voltage shift under a negative voltage bias than under a positive voltage bias. The gate structure may include a tunnel insulation layer 20, a charge trapping layer 30, a blocking insulation layer 40, and a gate electrode 50 that are sequentially stacked. In an example, the tunnel insulation layer 20 may include silicon oxide ($SiO_2$).

In the example embodiment of FIG. 2, in another example, the charge trapping layer 30 may include silicon rich oxide (SRO), such as $SiO_x$ (e.g., where 0<x<2), and/or a silicon nano-crystal (Si-nc). The charge trapping layer 30 (e.g., which may include SRO and/or Si-nc) may have a number of Si—Si bonds that may be conducive for trapping holes, such that hole trapping may occur substantially at the charge trapping layer 30. Therefore, flat band voltage may tend to shift to a negative value.

In the example embodiment of FIG. 2, in another example, the blocking insulation layer 40 may include $SiO_2$, and the gate electrode 50 may include Aluminum (Al).

In the example embodiment of FIG. 2, a first impurity region 13 and a second impurity region 15 may be formed in the substrate 11 outside the tunnel insulation layer 20 (e.g., by doping). The first impurity region 13 and the second impurity region 15 may be used as a drain (D) and a source (S), respectively.

Figure 3:
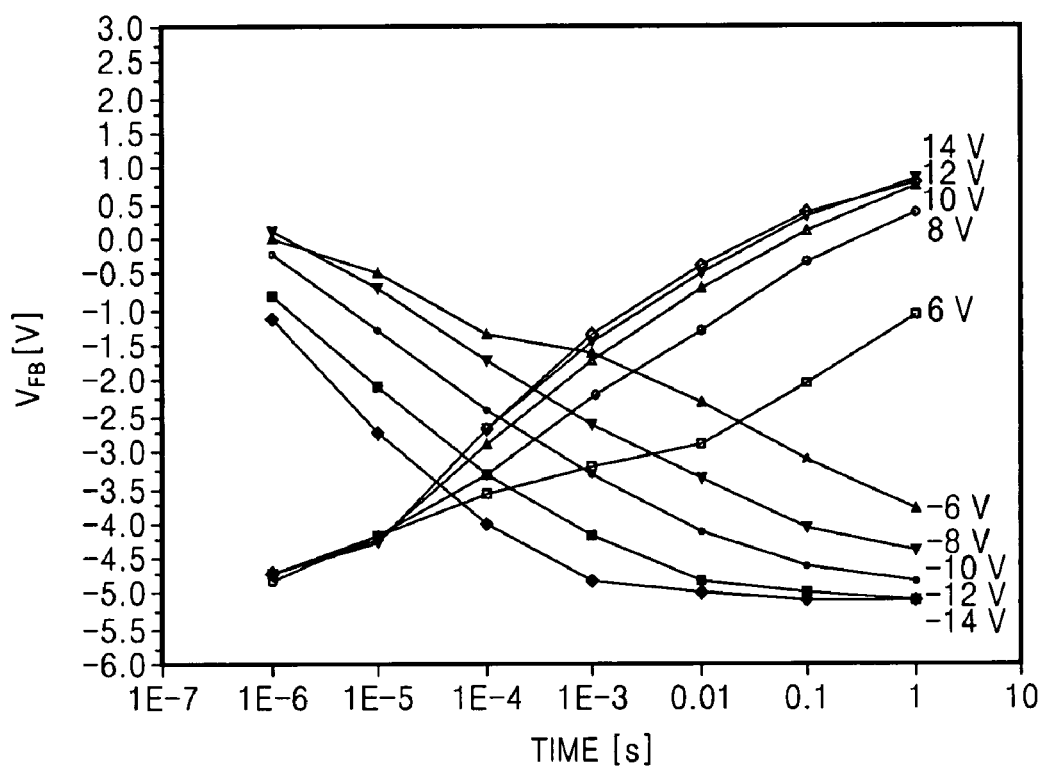
FIG. 3 illustrates flat band voltage shifts (V_FB(V)) with respect to a duration of an applied voltage bias if positive voltage biases and negative voltage biases are applied to the memory device depicted of FIG. 2 according to another example embodiment of the present invention.

FIG. 3 illustrates flat band voltage shifts ($V\_{FB}(V)$) with respect to a duration of an applied voltage bias (e.g., during a programming operation or an erasing operation) if positive voltage biases and negative voltage biases are applied to the memory device depicted 10 of FIG. 2 according to another example embodiment of the present invention.

Figure 1B:
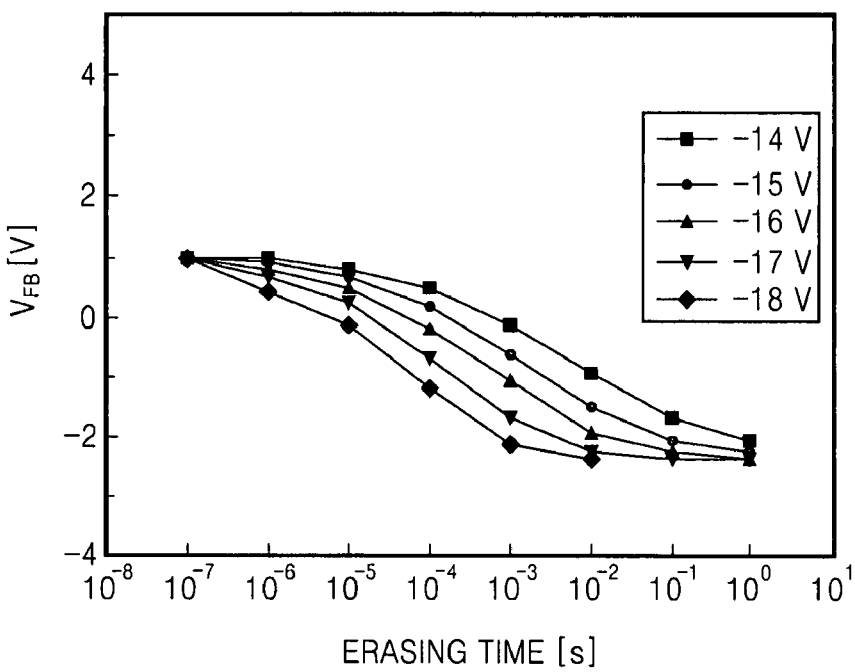
FIG. 1B illustrates flat band voltage shifts (V_FB[V] with respect to erasing time if negative voltage biases are applied to a conventional SONOS memory device.

In the example embodiment of FIG. 3, a positive voltage bias may be applied to a memory device to perform a programming operation, and a negative voltage bias may be applied to the memory device to perform an erasing operation. For example, referring again to the conventional art, the flat band voltage of a SONOS memory device may shift more rapidly under a positive voltage bias than under a negative voltage bias as shown in FIGS. 1A and 1B. Therefore, programming may be performed on the SONOS memory device more rapidly than erasing by programming the SONOS memory device under a positive voltage bias and erasing the SONOS memory device under a negative voltage bias. However, in the memory device 10 of the example embodiment of FIG. 2, the flat band voltage shift of the memory device 10 may be slower under a positive voltage bias than under a negative voltage bias, as shown in the example embodiment of FIG. 3.

In the example embodiment of FIG. 3, if the memory device 10 is programmed under a positive voltage bias and erased under a negative voltage bias, an erasing of the memory device 10 may be initiated after a first time period (e.g., after about 10 μs (1E-5 s)) and a programming of the memory device 10 may be initiated after a second time period (e.g., after about 1 ms (1E-3 s)), which may be longer than the first time period, as shown in the example embodiment of FIG. 3. That is, the programming speed may be slower than the erasing speed.

In another example embodiment of the present invention, if programming and erasing operations are performed on the memory device 10 using the same process as that of the SONOS memory device, the programming of the memory device 10 may be performed at a lower speed than the erasing of the memory device 10. In the example of a NAND flash memory device, programming may performed at a higher speed than erasing if the programming is performed in units of a page and the erasing is performed in units of a block.

In another example embodiment of the present invention, a negative bias voltage may be applied to the memory device 10 to perform a programming operation, and a positive voltage bias may be applied to the memory device 10 to perform an erasing operation, such that the programming may be performed at a higher speed than the erasing. For example, the programming may be performed within about 10 µs, and the erasing may be performed within about 1 ms.

In another example embodiment of the present invention, a programming voltage bias and an erasing voltage bias may be switched in polarity and may be input to the memory device 10 which may exhibit a faster flat band voltage shift under a negative voltage bias than under a positive voltage bias in order to perform programming at a higher speeds than erasing.

Figure 4:
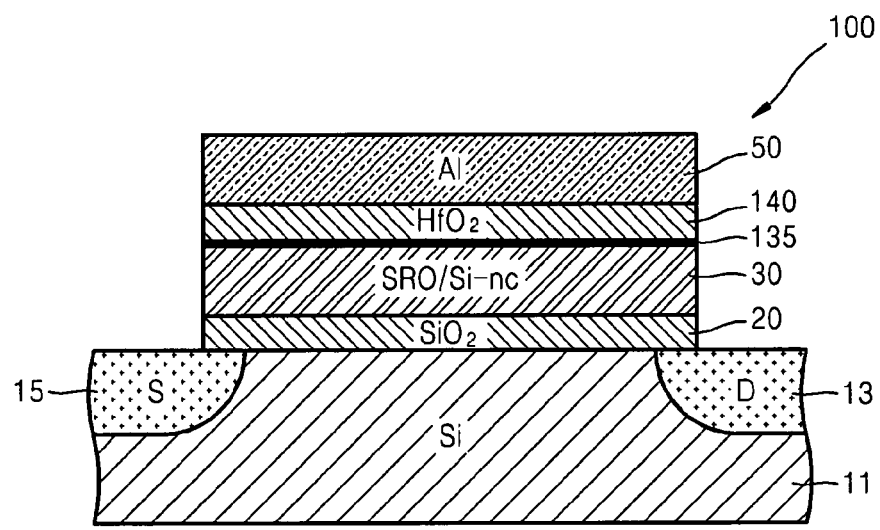
FIG. 4 illustrates another memory device according to another example embodiment of the present invention.

FIG. 4 illustrates a memory device 100 according to another example embodiment of the present invention. In the example embodiment of FIG. 4, the memory device 100 may include a blocking insulation layer 140 formed of a material having a higher permittivity than that of silicon oxide. For example, the blocking insulation layer 140 may include hafnium oxide ($HfO_2$). In the example embodiments of FIGS. 2 and 4, like reference numerals denote like elements. Thus, descriptions of duplicate elements presented in both FIGS. 2 and 4 have been omitted for the sake of brevity.

In the example embodiment of FIG. 4, the blocking insulation layer 140 may include $HfO_2$, and electrons may be trapped in a boundary surface 135 between the blocking insulation layer 140 and the charge trapping layer 30. Therefore, the boundary surface 135 may function as a charge trapping layer. Generally, electrons may tend to be trapped in a boundary surface between a $HfO_2$ layer and a silicon oxide layer or a silicon nano-crystal layer. Thus, if a $HfO_2$ layer is stacked (e.g., directly stacked) on the $SiO_2$ tunnel insulation layer 20 as the blocking insulation layer 140, a flat band voltage may tend to shift to a positive or plus value because the boundary surface between the $SiO_2$ tunnel insulation layer 20 and the blocking insulation layer 140 may function as a charge trapping layer.

Figure 5:
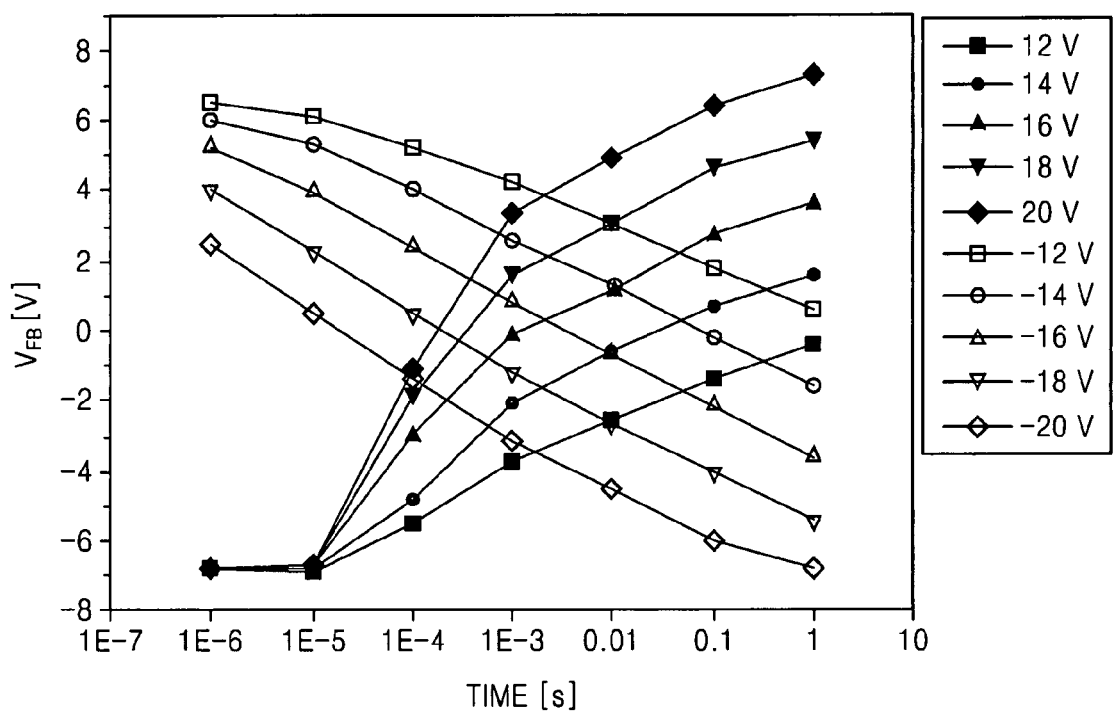
FIG. 5 illustrates flat band voltage shifts (V_FB(V)) with respect to a duration of an applied voltage if positive voltage biases and negative voltage biases are applied to the memory device depicted of FIG. 4 according to another example embodiment of the present invention.

FIG. 5 illustrates flat band voltage shifts ($V\_{FB}(V)$) with respect to a duration of an applied voltage bias (e.g., during a programming operation or an erasing operation) if positive voltage biases and negative voltage biases are applied to the memory device depicted 100 of FIG. 4 according to another example embodiment of the present invention.

In the example embodiment of FIG. 5, the memory device 100 of FIG. 4 may exhibit slower flat band voltage shifts under positive voltage biases than under negative voltage biases. Thus, similar to the memory device 10 of FIG. 2, the memory device 100 of FIG. 4 may exhibit faster flat band voltage shifts under negative voltage biases than under positive voltage biases.

In the example embodiment of FIG. 5, in an example, if the memory device 100 exhibits flat band voltages at intervals of 1.5 V if voltage biases are applied to the memory device 100 in intervals of 2 V, information (e.g., separate data bits or logic levels) may be distinguished between levels. Therefore, if programming is performed on the memory device 10 using a positive voltage, a programming time may be 1 ms, as illustrated in the example embodiment of FIG. 5. Thus, in the memory device 100 of FIG. 4, programming may be performed on the memory device 100 at a faster speed than that of erasing for the memory device 100 by applying a negative voltage bias to the memory device 100 for programming and applying a positive voltage bias for erasing.

Figure 6:
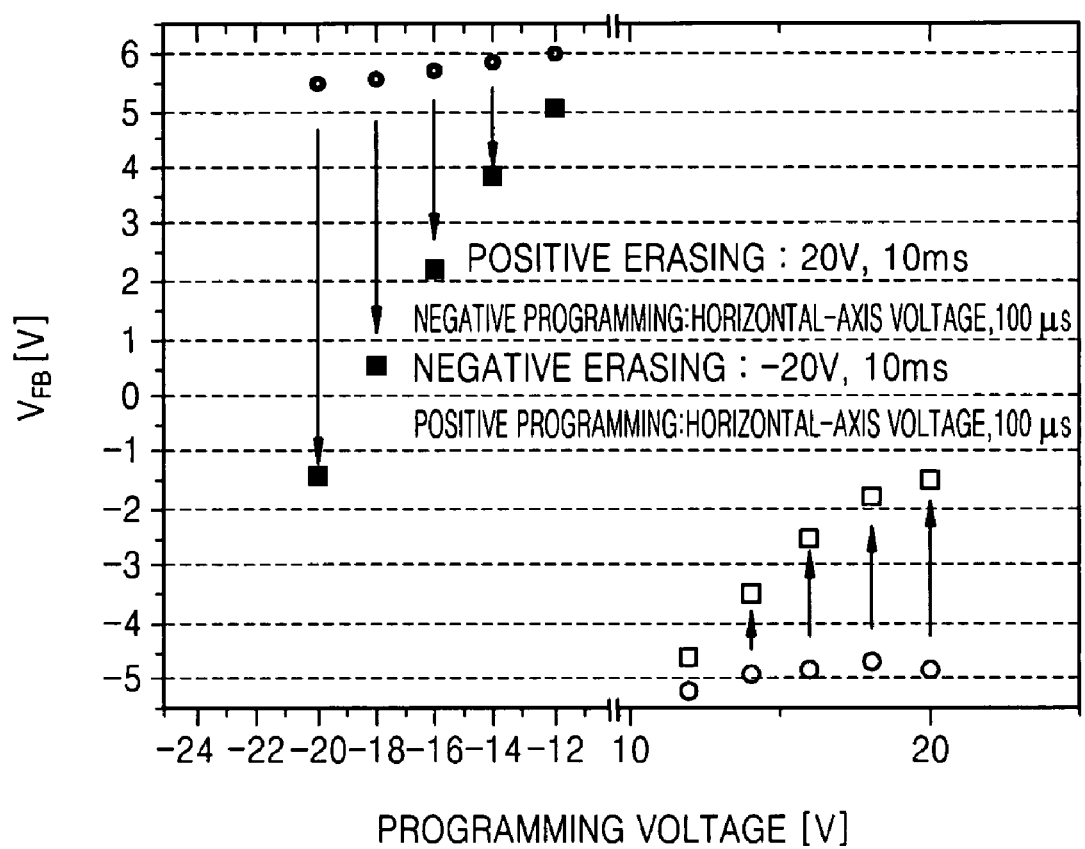
FIGS. 6 and 7 are graphs illustrating a flat band voltage shift versus programming voltage characteristics of a memory device that exhibits a faster flat band voltage shift under a negative voltage bias than under a positive voltage bias according to other example embodiments of the present invention.
Figure 7:
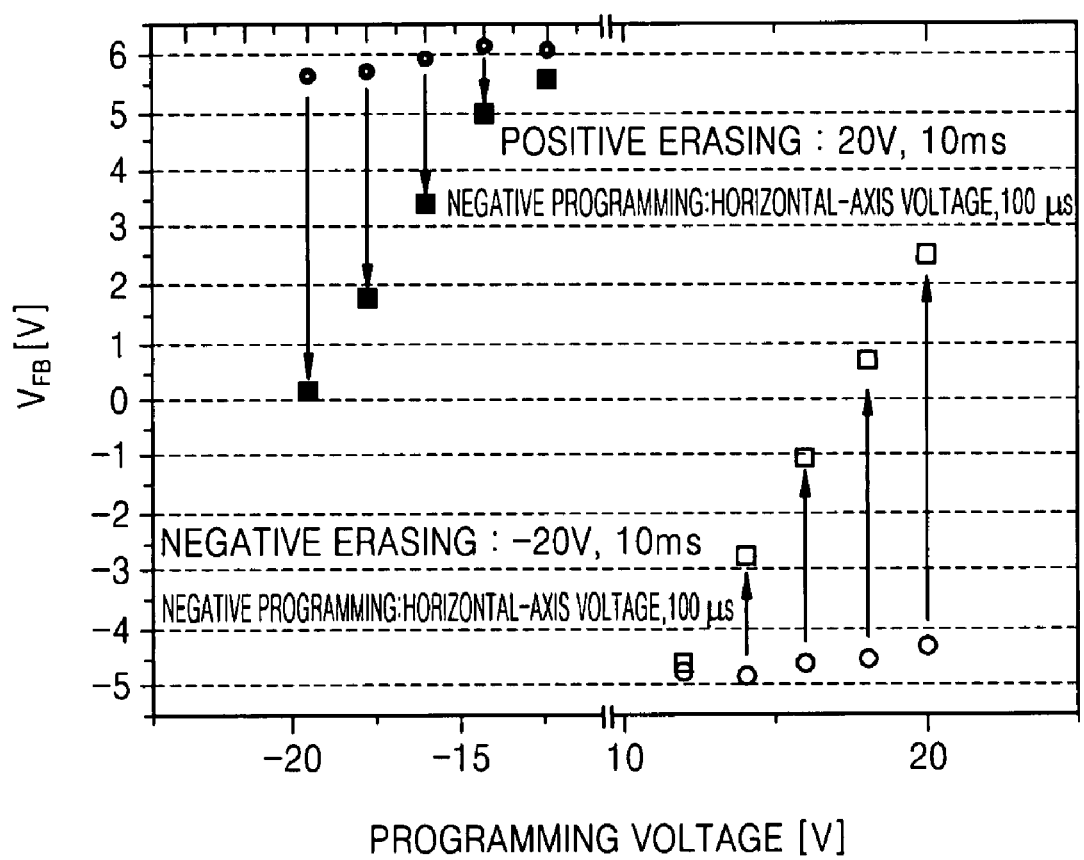

FIGS. 6 and 7 are graphs illustrating a flat band voltage shift versus programming voltage characteristics of a memory device that exhibits a faster flat band voltage shift under a negative voltage bias than under a positive voltage bias according to other example embodiments of the present invention. Samples C1 and C2 may be used to obtain the graphs of FIGS. 6 and 7, respectively.

Figure 8:
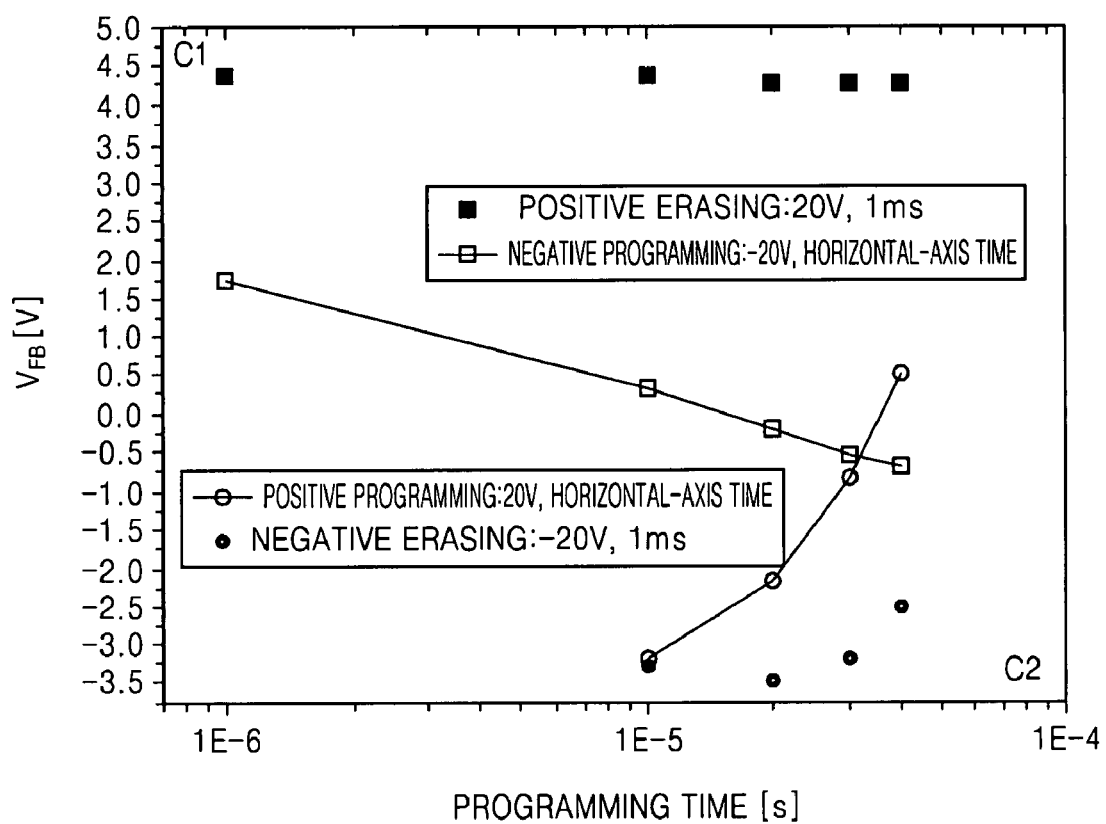
FIG. 8 is a graph illustrating flat band voltage versus programming time characteristics of the memory device samples according to another example embodiment of the present invention.

FIG. 8 is a graph illustrating flat band voltage versus programming time characteristics of the memory device samples C1 and C2 according to another example embodiment of the present invention.

In the example embodiments of FIGS. 6 and 7, flat band voltage shifts shown on left upper side may be obtained by applying a positive erasing voltage bias of 20 V for 10 ms (positive erasing, pe) and applying a horizontal-axis programming voltage (negative voltage bias) for 100 µs (negative programming, np). Further, flat band voltage shifts shown on right lower side in FIGS. 6 and 7 may be obtained by applying a negative erasing voltage bias of −20 V for 10 ms (negative erasing, ne) and applying a horizontal-axis programming voltage (positive voltage bias) for 100 µs (positive programming, pp).

In the example embodiment of FIG. 8, a positive voltage bias of 20 V may be applied to the sample C1 for 1 ms to perform positive erasing (pe), and a negative voltage bias of −20 V may be applied to the sample C1 for a programming time (e.g., indicated on a corresponding point of the horizontal axis) to perform negative programming (np). A positive voltage bias of 20 V may be applied to the sample C2 for a programming time (e.g., indicated on a corresponding point of the horizontal axis) to perform positive programming (pp), and a negative voltage bias of −20 V may be applied to the sample C2 for 1 ms to perform negative erasing (ne).

Referring again to the example embodiments of FIGS. 6 and 7, if the programming time is 100 µs, the programming speed in the case of negative programming (np)/positive erasing (pe) may be similar to or faster than that of positive programming (pp)/negative erasing (ne).

Referring again to the example embodiment of FIG. 8, in the case of negative programming (np)/positive erasing (pe), the programming speed may be improved at a programming time equal to or shorter than 40 µs (4×1E-5 s).

Figure 9:
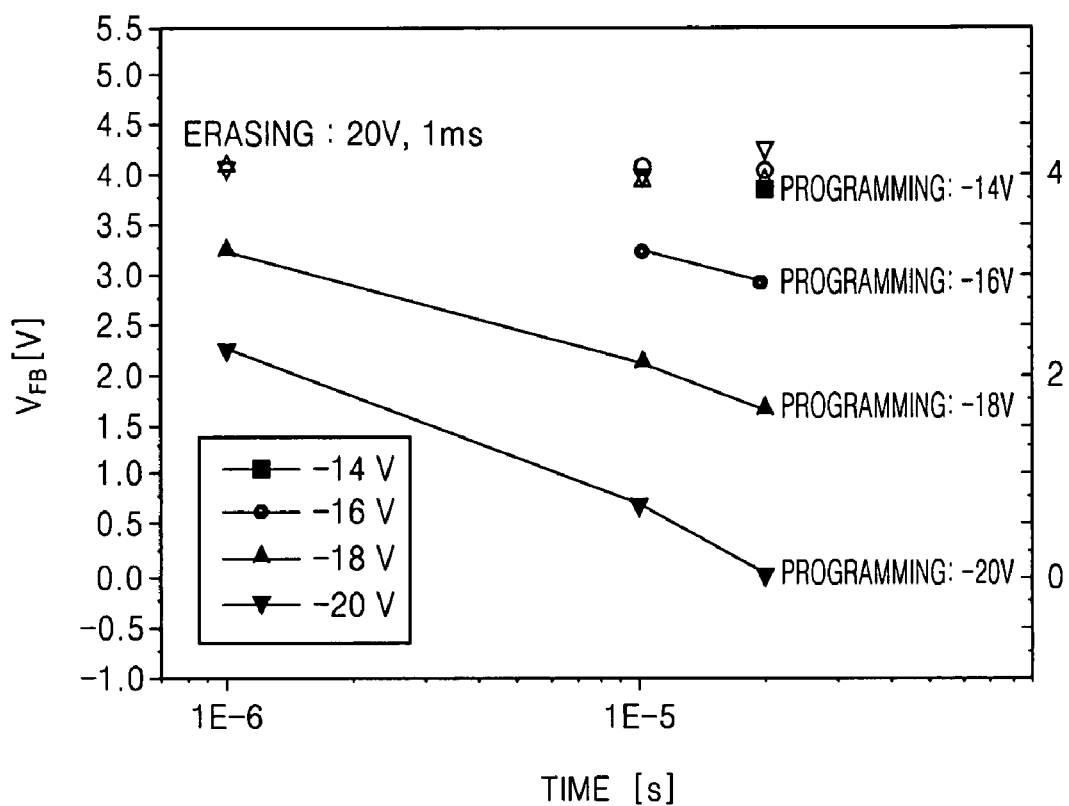
FIG. 9 is a graph showing a flat band voltage shift versus programming time characteristics of a memory device that exhibits a faster flat band voltage shift under a negative voltage bias than under a positive voltage bias according to another example embodiment of the present invention.

FIG. 9 is a graph showing a flat band voltage shift versus programming time characteristics of a memory device that exhibits a faster flat band voltage shift under a negative voltage bias than under a positive voltage bias according to another example embodiment of the present invention. In an example, the graph of FIG. 9 may be obtained by erasing a memory device under a positive voltage bias of 20 V for 1 ms and programming the memory device under negative voltage biases of −14 V, −16 V, −18 V, and −20 V (by using positive erasing (pe)/negative programming (np)).

In the example embodiment of FIG. 9, in an example, if the programming time is 20 µs, the memory device may exhibit flat band voltages at intervals of about 1 to 1.5 V in response to negative voltage biases applied thereto at intervals of 2 V, such that information (e.g., separate data bits or logic levels)

may be distinguished between levels. Accordingly, it will be appreciated that 4-bit information may be stored therein.

Figure 10:
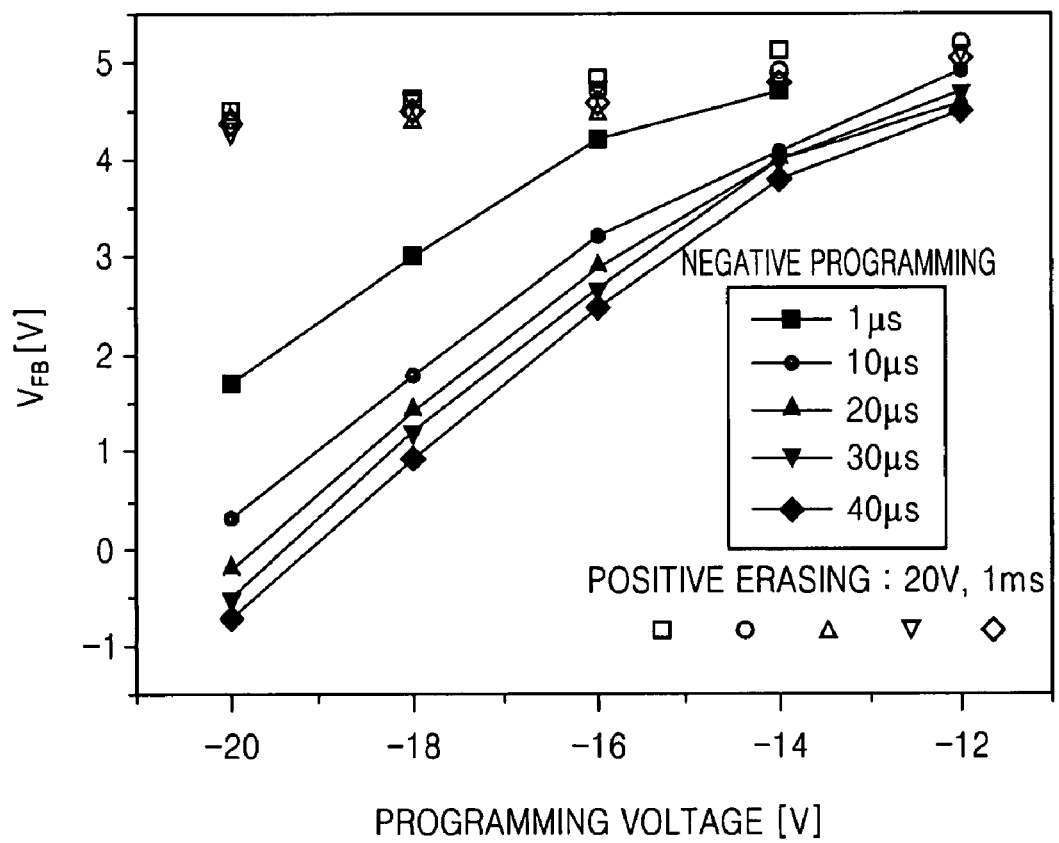
FIG. 10 is a graph illustrating a flat band voltage shift versus negative programming voltage characteristics of a memory device that exhibits a faster flat band voltage shift under a negative voltage bias than under a positive voltage bias according to another example embodiment of the present invention.

FIG. 10 is a graph illustrating a flat band voltage shift versus negative programming voltage characteristics of a memory device that exhibits a faster flat band voltage shift under a negative voltage bias than under a positive voltage bias according to another example embodiment of the present invention. In an example, the graph of FIG. 10 may be obtained by erasing a memory device under a positive voltage bias of 20 V for 1 ms and programming the memory device under negative voltage biases for 1 µs, 10 µs, 20 µs, 30 µs, and 40 µs (by using positive erasing (pe)/negative programming (np)).

In the example embodiment of FIG. 10, by using negative programming (np)/positive erasing (pe), a 4-level split may occur between 20 µs to 40 µs (e.g., as shown on the x-axis of the graph of FIG. 10). Therefore, if the above-described programming and erasing process is applied to a memory device exhibiting a faster flat band voltage shift under a negative voltage bias than under a positive voltage bias, information levels may be split to multiple levels (e.g., as shown in example FIG. 10, 4 levels at a programming time range of 20 µs to 40 µs during negative programming (np)/positive erasing (pe)). Therefore, multi-bit information, for example, 4-bit information, may be stored.

While above-described example embodiments of the present invention describe programming and erasing processes performed on the charge trapping memory devices 10 and 100 of FIGS. 2 and 4, it is understood that other example embodiments of the present invention may be directed to any type of memory device. For example, other example embodiments of the present invention may be directed to any memory device exhibiting a faster flat band voltage shift under a negative voltage bias than under a positive voltage bias.

In another example embodiment of the present invention, a memory device that operates slowly under a positive voltage bias but rapidly under a negative voltage bias may be programmed under a negative voltage bias and erased under a positive voltage bias. Therefore, the programming of the memory device may be performed more rapidly than the erasing of the memory device.

Further, a memory device that operates slowly under a positive voltage but rapidly under a negative voltage may be controlled to exhibit flat band voltages at given intervals throughout a given programming time range by applying negative voltage biases to the memory device, so that information (e.g., separate data bits or logic levels) may be distinguished between levels of the flat band voltage levels, and thus multi-level information may be stored in the memory device.

In another example embodiment of the present invention, to program and erase a memory device that exhibits a faster flat band shift under a negative voltage bias than under a positive voltage bias, a negative voltage bias may be applied to the memory device during a programming mode and a positive voltage bias may be applied to the memory device during an erasing mode.

Example embodiments of the present invention being thus described, it will be obvious that the same may be varied in many ways. Such variations are not to be regarded as a departure from the spirit and scope of example embodiments of the present invention, and all such modifications as would be obvious to one skilled in the art are intended to be included within the scope of the following claims.

What is claimed is:

1. A method of performing a memory operation on a memory device, comprising:
   applying a negative voltage bias to the memory device during a programming operation of the memory device; and
   applying a positive voltage bias to the memory device during an erasing operation of the memory device,
   wherein the memory device includes a gate structure exhibiting a faster flat band voltage shift if the negative voltage bias is applied as compared to if the positive voltage bias is applied.

2. The method of claim 1, wherein the negative voltage bias is one of −14 V, −16 V, −18 V and −20 V.

3. The method of claim 1, wherein the positive voltage bias is 20 V.

4. The method of claim 1, wherein the gate structure comprises a charge trapping layer formed of one of a silicon rich oxide (SRO) and a silicon nano crystal (Si-nc).

5. The method of claim 4, wherein the gate structure further comprises:
   a blocking insulation layer formed of $SiO_2$.

6. The method of claim 4, wherein the gate structure further comprises:
   a tunnel insulation layer between the substrate and the charge trapping layer; and
   a gate electrode formed above the charge trapping layer.

7. The method of claim 1, wherein the gate structure comprises:
   a charge trapping layer formed of one of a silicon rich oxide (SRO) and a silicon nano crystal (Si-nc); and
   a blocking insulation layer formed of a dielectric material having a permittivity higher than that of a silicon oxide.

8. The method of claim 7, wherein the blocking insulation layer is formed of $HfO_2$.

9. The method of claim 7, wherein the gate structure further comprises:
   a tunnel insulation layer between the substrate and the charge trapping layer; and
   a gate electrode formed above the charge trapping layer.

10. The method of claim 9, wherein the memory device further comprises:
    a first impurity region and a second impurity region that are formed in the substrate outside the tunnel insulation layer by doping.

11. A memory device, comprising:
    a substrate and a gate structure formed on the substrate, the gate structure exhibiting a faster flat band voltage shift under a negative voltage bias than under a positive voltage bias, the gate structure receiving a negative voltage bias during a programming of the memory device and receiving a positive voltage bias during an erasing operation of the memory device.

12. The memory device of claim 11, wherein the gate structure includes:
    a charge trapping layer including one of silicon rich oxide (SRO) and silicon nano crystal (Si-nc).

13. The memory device of claim 12, wherein the gate structure further includes a blocking insulation layer including $SiO_2$.

14. The memory device of claim 12, wherein the gate structure further includes:
    a tunnel insulation layer positioned between the substrate and the charge trapping layer; and
    a gate electrode formed above the charge trapping layer.

15. The memory device of claim 11, wherein the gate structure includes:
  a charge trapping layer including one of SRO and Si-nc; and
  a blocking insulation layer including a dielectric material having a permittivity higher than that of a silicon oxide.

16. The memory device of claim 15, wherein the blocking insulation layer includes $HfO_2$.

17. The memory device of claim 15, wherein the gate structure further includes:
  a tunnel insulation layer positioned between the substrate and the charge trapping layer; and
  a gate electrode formed above the charge trapping layer.

18. The memory device of claim 17, wherein the memory device further includes: a first impurity region and a second impurity region formed in the substrate outside the tunnel insulation layer with a doping process.

* * * * *